(12) United States Patent
Ben Atar et al.

(10) Patent No.: US 12,712,554 B2
(45) Date of Patent: Aug. 18, 2026

(54) APPARATUS, SYSTEM, AND METHOD OF LOCAL OSCILLATOR (LO) GENERATOR

(71) Applicant: INTEL CORPORATION, Santa Clara, CA (US)

(72) Inventors: Kobi Ben Atar, Mazkeret Batya (IL); Nir Weisman, Hod Hasharon (IL); Run Levinger, Portland, OR (US); Danniel Nahmanny, Givat Shapira (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 18/870,435

(22) PCT Filed: Jun. 30, 2022

(86) PCT No.: PCT/US2022/035637

§ 371 (c)(1), (2) Date: Nov. 28, 2024

(87) PCT Pub. No.: WO2024/005813

PCT Pub. Date: Jan. 4, 2024

(65) Prior Publication Data

US 2025/0350288 A1 Nov. 13, 2025

(51) Int. Cl.

| | |
|---|---|
| ***H03K 3/03*** | (2006.01) |
| ***H03L 7/099*** | (2006.01) |
| ***H03L 7/24*** | (2006.01) |

(52) U.S. Cl.

CPC ......... *H03L 7/0992* (2013.01); *H03K 3/0315* (2013.01); *H03L 7/0995* (2013.01); *H03L 7/24* (2013.01)

(58) Field of Classification Search

CPC .... H03B 27/00; H03K 3/0315; H03K 3/0322; H03K 21/02; H03K 21/026; H03K 21/10;

(Continued)

(56) References Cited

U.S. PATENT DOCUMENTS

| | | | |
|---|---|---|---|
| 7,403,048 B2 * | 7/2008 | Heidari | H03K 23/44 327/117 |
| 10,715,150 B1 * | 7/2020 | Carey | H03K 21/10 |

(Continued)

FOREIGN PATENT DOCUMENTS

| | | |
|---|---|---|
| JP | 2013-504268 | 2/2013 |
| KR | 10-2391222 | 4/2022 |

OTHER PUBLICATIONS

Yung-Chung Lo et al., “A 1.8V, Sub-mW, Over 100% Locking Range, Divide-by-3 and 7 Complementary-Injection-Locked 4 GHz Frequency Divider”, IEEE 2009 Custom Intergrated Circuits Conference (CICC), pp. 259-262.

(Continued)

*Primary Examiner* — Levi Gannon

(74) *Attorney, Agent, or Firm* — Shichrur & Co.

(57) ABSTRACT

For example, a Local Oscillator (LO) generator may include a plurality of frequency sources configured to provide a respective plurality of frequency source signals according to a first frequency; and an injection-locked frequency divider configured to provide an LO signal having a second frequency. In one example, the second frequency may be based on the first frequency divided by a factor n. For example, the factor n may be an odd integer greater than one. For example, the injection-locked frequency divider may include a plurality of injection paths to inject the plurality of frequency source signals into an injection-locked Ring Oscillator (RO).

20 Claims, 6 Drawing Sheets

(58) Field of Classification Search
CPC ...... H03K 23/52; H03K 23/54; H03L 7/0992; H03L 7/0995; H03L 7/0997; H03L 7/18; H03L 7/24
See application file for complete search history.

(56) References Cited

U.S. PATENT DOCUMENTS

| | | | | |
|---|---|---|---|---|
| 2005/0248410 | A1* | 11/2005 | Su | H03K 3/0322 331/16 |
| 2007/0024330 | A1* | 2/2007 | Mirzaei | H03K 3/012 327/115 |
| 2008/0231379 | A1* | 9/2008 | Jang | H03K 3/356121 331/57 |
| 2009/0033430 | A1* | 2/2009 | Jang | H03B 19/14 331/57 |
| 2009/0251177 | A1* | 10/2009 | Jang | H03B 5/1212 327/118 |
| 2011/0001521 | A1* | 1/2011 | Lorenzon | H03K 23/52 327/115 |
| 2011/0050296 | A1* | 3/2011 | Fagg | H03B 5/1228 327/118 |
| 2012/0038396 | A1* | 2/2012 | Shima | H03L 7/08 327/117 |
| 2014/0266471 | A1* | 9/2014 | Zhu | H03L 7/18 331/34 |
| 2017/0163273 | A1* | 6/2017 | Xu | H03L 7/24 |
| 2018/0205386 | A1 | 7/2018 | Kim et al. | |
| 2021/0218408 | A1* | 7/2021 | Hong | H03L 7/0995 |
| 2021/0367629 | A1 | 11/2021 | Ravi et al. | |

OTHER PUBLICATIONS

Ahmad Mirzaei et al., "Multi-Phase Injection Widens Lock Range of Ring-Oscillator-Based Frequency Dividers", IEEE Journal of Solid-State Circuits, vol. 43, No. 3, Mar. 2008, pp. 656-671.

International Search Report and the Written Opinion for International Application No. PCT/US2022/035637, mailed on Apr. 3, 2023, 8 pages.

* cited by examiner 201
260
264
217
216
230
215
214
220
263
247
244
DPLL2
212
213
210
262
245
242
DPLL1
250
243
240
200

APPARATUS, SYSTEM, AND METHOD OF LOCAL OSCILLATOR (LO) GENERATOR

TECHNICAL FIELD

Aspects described herein generally relate to a Local Oscillator (LO) generator.

BACKGROUND

Some devices, for example, radar devices and/or wireless communication devices, may include a plurality of Physical Layer (PHY) chains, which may communicate Radio Frequency (RF) signals via a plurality of antennas.

The PHY chains may include one or more elements and/or complements, which may be operated based on a frequency signal, e.g., a Local oscillator (LO) signal.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
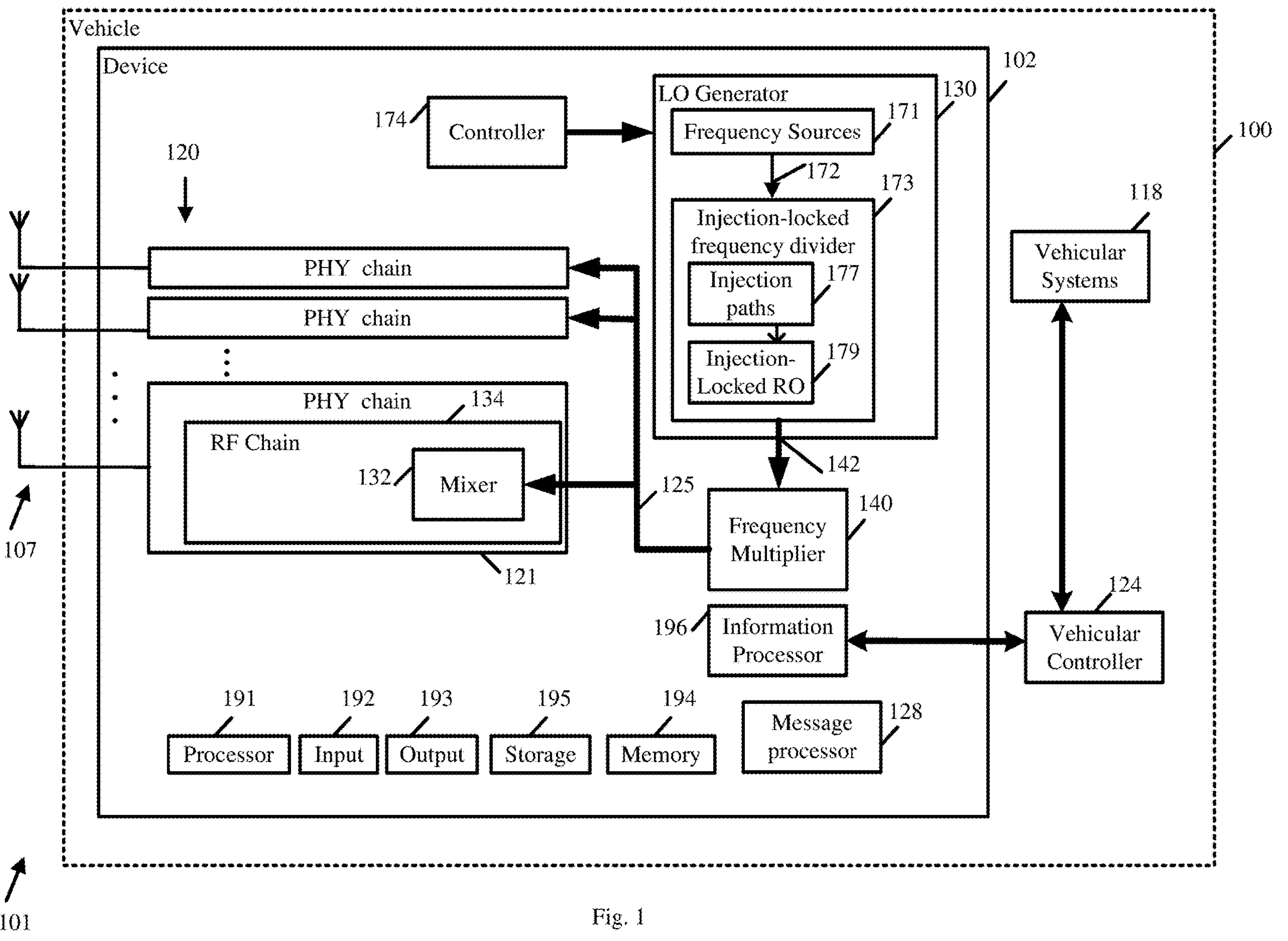
FIG. 1 is a schematic block diagram illustration of a system, in accordance with some demonstrative aspects.

In the following detailed description, numerous specific details are set forth in order to provide a thorough understanding of some aspects. However, it will be understood by persons of ordinary skill in the art that some aspects may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality", as used herein, include, for example, "multiple" or "two or more". For example, "a plurality of items" includes two or more items.

The words "exemplary" and "demonstrative" are used herein to mean "serving as an example, instance, demonstration, or illustration". Any aspect, aspect, or design described herein as "exemplary" or "demonstrative" is not necessarily to be construed as preferred or advantageous over other aspects, aspects, or designs.

References to "one aspect", "an aspect", "demonstrative aspect", "various aspects" etc., indicate that the aspect(s) so described may include a particular feature, structure, or characteristic, but not every aspect necessarily includes the particular feature, structure, or characteristic. Further, repeated use of the phrase "in one aspect" does not necessarily refer to the same aspect, although it may.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

The phrases "at least one" and "one or more" may be understood to include a numerical quantity greater than or equal to one, e.g., one, two, three, four, [ . . . ], etc. The phrase "at least one of" with regard to a group of elements may be used herein to mean at least one element from the group consisting of the elements. For example, the phrase "at least one of" with regard to a group of elements may be used herein to mean one of the listed elements, a plurality of one of the listed elements, a plurality of individual listed elements, or a plurality of a multiple of individual listed elements.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and/or may represent any information as understood in the art.

Some aspects may be used in conjunction with various devices and systems, for example, a radar sensor, a radar device, a radar system, a vehicle, a vehicular system, an autonomous vehicular system, a vehicular communication system, a vehicular device, a sensor device, a wireless communication device, a User Equipment (UE), a Mobile Device (MD), a wireless station (STA), a Personal Computer (PC), a desktop computer, a mobile computer, a laptop computer, a notebook computer, a tablet computer, a handheld computer, a sensor device, an Internet of Things (IoT) device, a wearable device, a handheld device, a Personal Digital Assistant (PDA) device, a handheld PDA device, a non-vehicular device, a mobile or portable device, a consumer device, a non-mobile or non-portable device, a wireless communication station, a wireless Access Point (AP), a wired or wireless router, a wired or wireless modem, a video device, an audio device, an audio-video (A/V) device, a wired or wireless network, a wireless area network, a Wireless Video Area Network (WVAN), a Local Area Network (LAN), a Wireless LAN (WLAN), a Personal Area Network (PAN), a Wireless PAN (WPAN), and the like.

Some aspects may be used in conjunction with one way and/or two-way radio communication systems, cellular radio-telephone communication systems, a mobile phone, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some aspects may be used in conjunction with Radio Frequency (RF) systems, wireless communication systems, radar systems, vehicular radar systems, autonomous systems, robotic systems, detection systems, and/or any other systems.

Some demonstrative aspects may be used in conjunction with an RF frequency in a frequency band having a starting frequency above 10 Gigahertz (GHz), for example, a frequency band having a starting frequency between 10 Ghz and 120 GHz. For example, some demonstrative aspects may be used in conjunction with an RF frequency having a starting frequency above 30 Ghz, for example, above 45 GHz, e.g., above 60 GHz. For example, some demonstrative aspects may be used in conjunction with an automotive radar frequency band, e.g., a frequency band between 76 GHz and 81 GHz. For example, some demonstrative aspects may be used in conjunction with wireless communication frequency band, for example, a wireless communication network communicating over a frequency band of 2.4 GHz, 5 GHz, and/or 6-7 GHz, an Extremely High Frequency (EHF) band (the millimeter wave (mmWave) frequency band), e.g., a frequency band within the frequency band of between 20 GHz and 300 GHz, e.g., a frequency band above 45 GHz, a WLAN frequency band, a WPAN frequency band, and the like. However, other aspects may be implemented utilizing any other suitable frequency bands, for example, a frequency band above 140 GHz, a frequency band of 300 GHz, a sub Terahertz (Thz) band, a THz band, and/or any other frequency band.

Some demonstrative aspects may be used in conjunction with a WLAN, e.g., a WiFi network. Other aspects may be used in conjunction with any other suitable wireless communication network, for example, a wireless area network, a "piconet", a WPAN, a WVAN and the like.

Some aspects may be used in conjunction with devices and/or networks operating in accordance with existing IEEE 802.11 standards (including IEEE 802.11-2020 (IEEE 802.11-2020, *IEEE Standard for Information Technology—Telecommunications and Information Exchange between Systems Local and Metropolitan Area Networks—Specific Requirements; Part* 11: *Wireless LAN Medium Access Control* (*MAC*) *and Physical Layer* (*PHY*) *Specifications*, December, 2020)), and/or future versions and/or derivatives thereof, devices and/or networks operating in accordance with existing cellular specifications and/or protocols, units and/or devices which are part of the above networks, and the like.

Some aspects may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), FDM Time-Division Multiplexing (TDM), Time-Division Multiple Access (TDMA), Multi-User MIMO (MU-MIMO), Spatial Division Multiple Access (SDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G), or Sixth Generation (6G) mobile networks, 3GPP, Long Term Evolution (LTE), LTE advanced, Enhanced Data rates for GSM Evolution (EDGE), or the like. Other aspects may be used in various other devices, systems and/or networks.

The terms "processor" or "controller" may be understood to include any kind of technological entity that allows handling of any suitable type of data and/or information. The data and/or information may be handled according to one or more specific functions executed by the processor or controller. Further, a processor or a controller may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), and the like, or any combination thereof. Any other kind of implementation of the respective functions, which will be described below in further detail, may also be understood as a processor, controller, or logic circuit. It is understood that any two (or more) processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

The term "memory" is understood as a computer-readable medium (e.g., a non-transitory computer-readable medium) in which data or information can be stored for retrieval. References to "memory" may thus be understood as referring to volatile or non-volatile memory, including random access memory (RAM), read-only memory (ROM), flash memory, solid-state storage, magnetic tape, hard disk drive, optical drive, among others, or any combination thereof. Registers, shift registers, processor registers, data buffers, among others, are also embraced herein by the term memory. The term "software" may be used to refer to any type of executable instruction and/or logic, including firmware.

A "vehicle" may be understood to include any type of driven object. By way of example, a vehicle may be a driven object with a combustion engine, an electric engine, a reaction engine, an electrically driven object, a hybrid driven object, or a combination thereof. A vehicle may be, or may include, an automobile, a bus, a mini bus, a van, a truck, a mobile home, a vehicle trailer, a motorcycle, a bicycle, a tricycle, a train locomotive, a train wagon, a moving robot, a personal transporter, a boat, a ship, a submersible, a submarine, a drone, an aircraft, a rocket, among others.

A "ground vehicle" may be understood to include any type of vehicle, which is configured to traverse the ground, e.g., on a street, on a road, on a track, on one or more rails, off-road, or the like.

An "autonomous vehicle" may describe a vehicle capable of implementing at least one navigational change without driver input. A navigational change may describe or include a change in one or more of steering, braking, acceleration/deceleration, or any other operation relating to movement, of the vehicle. A vehicle may be described as autonomous even in case the vehicle is not fully autonomous, for example, fully operational with driver or without driver input. Autonomous vehicles may include those vehicles that can operate under driver control during certain time periods, and without driver control during other time periods. Additionally or alternatively, autonomous vehicles may include vehicles that control only some aspects of vehicle navigation, such as steering, e.g., to maintain a vehicle course between vehicle lane constraints, or some steering operations under certain circumstances, e.g., not under all circumstances, but may leave other aspects of vehicle navigation to the driver, e.g., braking or braking under certain circumstances. Additionally or alternatively, autonomous vehicles may include vehicles that share the control of one or more aspects of vehicle navigation under certain circumstances, e.g., hands-on, such as responsive to a driver input; and/or vehicles that control one or more aspects of vehicle navigation under certain circumstances, e.g., hands-off, such as independent of driver input. Additionally or alternatively, autonomous vehicles may include vehicles that control one or more aspects of vehicle navigation under certain circumstances, such as under certain environmental conditions, e.g., spatial areas, roadway conditions, or the like. In some aspects, autonomous vehicles may handle some or all aspects of braking, speed control, velocity control, steering, and/or any other additional operations, of the vehicle. An autonomous vehicle may include those vehicles that can operate without a driver. The level of autonomy of a vehicle may be described or determined by the Society of Automotive Engineers (SAE) level of the vehicle, e.g., as defined by the SAE, for example in SAE J3016 2018*: Taxonomy and definitions for terms related to driving automation systems for on road motor vehicles*, or by other relevant professional organizations. The SAE level may have a value ranging from a minimum level, e.g., level 0 (illustratively, substantially no driving automation), to a maximum level, e.g., level 5 (illustratively, full driving automation).

An "assisted vehicle" may describe a vehicle capable of informing a driver or occupant of the vehicle of sensed data or information derived therefrom.

The phrase "vehicle operation data" may be understood to describe any type of feature related to the operation of a vehicle. By way of example, "vehicle operation data" may describe the status of the vehicle, such as, the type of tires of the vehicle, the type of vehicle, and/or the age of the manufacturing of the vehicle. More generally, "vehicle operation data" may describe or include static features or static vehicle operation data (illustratively, features or data not changing over time). As another example, additionally or alternatively, "vehicle operation data" may describe or include features changing during the operation of the vehicle, for example, environmental conditions, such as weather conditions or road conditions during the operation of the vehicle, fuel levels, fluid levels, operational parameters of the driving source of the vehicle, or the like. More generally, "vehicle operation data" may describe or include varying features or varying vehicle operation data (illustratively, time varying features or data).

The term "wireless device", as used herein, includes, for example, a device capable of wireless communication, a communication device capable of wireless communication, a communication station capable of wireless communication, a portable or non-portable device capable of wireless communication, or the like. In some demonstrative aspects, a wireless device may be or may include a peripheral that may be integrated with a computer, or a peripheral that may be attached to a computer. In some demonstrative aspects, the term "wireless device" may optionally include a wireless service.

The term "communicating" as used herein with respect to a communication signal includes transmitting the communication signal and/or receiving the communication signal. For example, a communication unit, which is capable of communicating a communication signal, may include a transmitter to transmit the communication signal to at least one other communication unit, and/or a communication receiver to receive the communication signal from at least one other communication unit. The verb communicating may be used to refer to the action of transmitting or the action of receiving. In one example, the phrase "communicating a signal" may refer to the action of transmitting the signal by a first device, and may not necessarily include the action of receiving the signal by a second device. In another example, the phrase "communicating a signal" may refer to the action of receiving the signal by a first device, and may not necessarily include the action of transmitting the signal by a second device. The communication signal may be transmitted and/or received, for example, in the form of Radio Frequency (RF) communication signals, and/or any other type of signal.

As used herein, the term "circuitry" may refer to, be part of, or include, an Application Specific Integrated Circuit (ASIC), an integrated circuit, an electronic circuit, a processor (shared, dedicated or group), and/or memory (shared. Dedicated, or group), that execute one or more software or firmware programs, a combinational logic circuit, and/or other suitable hardware components that provide the described functionality. In some aspects, some functions associated with the circuitry may be implemented by one or more software or firmware modules. In some aspects, circuitry may include logic, at least partially operable in hardware.

The term "logic" may refer, for example, to computing logic embedded in circuitry of a computing apparatus and/or computing logic stored in a memory of a computing apparatus. For example, the logic may be accessible by a processor of the computing apparatus to execute the computing logic to perform computing functions and/or operations. In one example, logic may be embedded in various types of memory and/or firmware, e.g., silicon blocks of various chips and/or processors. Logic may be included in, and/or implemented as part of, various circuitry, e.g. radio circuitry, receiver circuitry, control circuitry, transmitter circuitry, transceiver circuitry, processor circuitry, and/or the like. In one example, logic may be embedded in volatile memory and/or non-volatile memory, including random access memory, read only memory, programmable memory, magnetic memory, flash memory, persistent memory, and the like. Logic may be executed by one or more processors using memory, e.g., registers, stuck, buffers, and/or the like, coupled to the one or more processors, e.g., as necessary to execute the logic.

The term "antenna", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

Some demonstrative aspects are described herein with respect to RF signals, e.g., RF radar signals, and/or RF wireless communication signals. However, other aspects may be implemented with respect to any other wireless signals, wireless communication signals, communication scheme, network, standard and/or protocol.

Reference is now made to FIG. 1, which schematically illustrates a block diagram of a system 101, in accordance with some demonstrative aspects.

In some demonstrative aspects, system 101 may include at least one device 102, e.g., as described below.

In some demonstrative aspects, device 102 may include a radar device. For example, device 102 may include a radar detecting device, a radar sensing device, a radar sensor, or the like, e.g., as described below.

In some demonstrative aspects, device 102 may include a Multiple Input Multiple Output (MIMO) radar, e.g., as described below.

In other aspects, device 102 may include any other type of radar, e.g., as described below.

In some demonstrative aspects, device 102 may be configured to detect, and/or sense, one or more objects, which are located in a vicinity, e.g., a far vicinity and/or a near vicinity, to radar 102, and to provide one or more parameters, attributes, and/or information with respect to the objects.

In some demonstrative aspects, device 102 may be implemented, for example, as part of a vehicular system.

In some demonstrative aspects, the vehicular system may include, for example, an autonomous vehicle system, an automated driving system, a driver assistance and/or support system, and/or the like.

In some demonstrative aspects, system 101 may include a vehicular system including a vehicle 100, e.g., as described below.

In some demonstrative aspects, one or more elements and/or components of device 102 may be implemented and/or mounted in vehicle 100.

In some demonstrative aspects, device 102 may be configured to detect, and/or sense, one or more objects, which are located in a vicinity, e.g., a far vicinity and/or a near vicinity, of the vehicle 100, and to provide one or more parameters, attributes, and/or information with respect to the objects.

In some demonstrative aspects, the objects may include other vehicles, pedestrians, traffic signs, traffic lights, roads and/or the like.

In some demonstrative aspects, the one or more parameters, attributes and/or information with respect to an object may include a range of the object from the vehicle 100, an angle of the object with respect to the vehicle 100, a location of the object with respect to the vehicle 100, a relative speed of the object, and/or the like.

In some demonstrative aspects, device 102 may include an information processor 196 configured to perform and/or to trigger, cause, instruct and/or control device 102 to perform one or more functionalities, operations and/or procedures, and/or to communicate one or more messages and/or transmissions.

In some demonstrative aspects, information processor 196 may include, or may be implemented, partially or entirely, by circuitry and/or logic, e.g., one or more processors including circuitry and/or logic, memory circuitry and/or logic. Additionally or alternatively, one or more functionalities of information processor 196 may be implemented by logic, which may be executed by a machine and/or one or more processors, e.g., as described below.

In one example, information processor 196 may include at least one memory, e.g., coupled to the one or more processors, which may be configured, for example, to store, e.g., at least temporarily, at least some of the information processed by the one or more processors and/or circuitry, and/or which may be configured to store logic to be utilized by the processors and/or circuitry.

In other aspects, information processor 196 may be implemented by one or more additional or alternative elements of device 102.

In some demonstrative aspects, information processor 196 may include a radar processor configured to process radar information of radar device 102 and/or to control one or more operations of radar device 102, e.g., as described below.

In some demonstrative aspects, information processor 196 may be configured to generate radar information, for example, based on radar signals communicated by device 102, e.g., as described below.

In some demonstrative aspects, vehicle 100 may include a vehicular controller 124 configured to control one or more functionalities, components, devices, systems and/or elements of vehicle 100.

In some demonstrative aspects, vehicular controller 124 may be configured to control one or more vehicular systems 118 of vehicle 100, e.g., as described below.

In some demonstrative aspects, vehicular systems 118 may include, for example, a steering system, a braking system, a driving system, and/or any other system of the vehicle 100.

In some demonstrative aspects, vehicular controller 124 may be configured to control device 102, and/or to process one or more parameters, attributes and/or information from information processor 196 and/or device 102.

In some demonstrative aspects, vehicular controller 124 may be configured, for example, to control the vehicular systems 118 of the vehicle, for example, based on the radar information from information processor 196, and/or one or more other sensors of the vehicle, e.g., Light Detection and Ranging (LIDAR) sensors, camera sensors, and/or the like.

In one example, vehicular controller 124 may control the steering system, the braking system, and/or any other vehicular systems 118 of vehicle 100, for example, based on the information from device 102, e.g., based on one or more objects detected by device 102.

In other aspects, vehicular controller 124 may be configured to control any other additional or alternative functionalities of vehicle 100.

In some demonstrative aspects, device 102 may include a radar device, e.g., as described above. In other aspects, device 102 may include or may be implemented as part of a wireless communication device configured to communicate with one or more other wireless communication devices in a wireless communication system, e.g., as described below.

In some demonstrative aspects, system 100 may include a wireless communication system including the wireless communication device 102.

In some demonstrative aspects, information processor 196 may be configured to control and/or process one or more wireless communications to be transmitted by and/or received by device 102. For example, information processor 196 may be configured to process information to be transmitted in a wireless communication transmission by device

102, and/or to process information received by device 102 in one or more wireless communication transmissions.

In one example, device 102 may include, for example, a UE, an MD, a STA, a Smartphone, mobile phone, a cellular telephone, an AP, a PC, a desktop computer, a mobile computer, a laptop computer, an Ultrabook™ computer, a notebook computer, a tablet computer, a server computer, a handheld computer, an Internet of Things (IoT) device, a sensor device, a handheld device, a wearable device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a PCS device, a PDA device which incorporates a wireless communication device, a mobile or portable GPS device, a DVB device, a relatively small computing device, a non-desktop computer, a "carry Small Live Large" (CSLL) device, an Ultra Mobile Device (UMD), an Ultra Mobile PC (UMPC), a Mobile Internet Device (MID), or the like.

In some demonstrative aspects, device 102 may include, for example, one or more of a processor 191, an input unit 192, an output unit 193, a memory unit 194, and/or a storage unit 195. Device 102 may optionally include other suitable hardware components and/or software components. In some demonstrative aspects, some or all of the components of one or more of device 102 may be enclosed in a common housing or packaging, and may be interconnected or operably associated using one or more wired or wireless links. In other aspects, components of one or more of device 102 may be distributed among multiple or separate devices.

In some demonstrative aspects, processor 191 may include, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 191 executes instructions, for example, of an Operating System (OS), e.g., a vehicular operating system, of device 102 and/or of one or more suitable applications.

In some demonstrative aspects, input unit 192 may include, for example, a touch-screen, a touch-pad, a track-ball, a stylus, a microphone, or other suitable pointing device or input device. Output unit 193 includes, for example, a monitor, a screen, a touch-screen, a flat panel display, a Light Emitting Diode (LED) display unit, a Liquid Crystal Display (LCD) display unit, one or more audio speakers or earphones, or other suitable output devices.

In some demonstrative aspects, memory unit 194 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 195, for example, a hard disk drive, a floppy disk drive, a Compact Disk (CD) drive, a CD-ROM drive, a DVD drive, or other suitable removable or non-removable storage units. Memory unit 194 and/or storage unit 195, for example, may store data processed by device 102.

In some demonstrative aspects, information processor 196 may be configured to perform and/or to trigger, cause, instruct and/or control device 102 to perform one or more functionalities, operations and/or procedures, and/or to perform one or more wireless communications, to generate and/or communicate one or more messages and/or wireless transmissions.

In some demonstrative aspects, device 102 may include a message processor 128 configured to generate, process and/or access one or more messages communicated by device 102.

In one example, message processor 128 may be configured to generate one or more messages to be transmitted by device 102, and/or message processor 128 may be configured to access and/or to process one or more messages received by device 102, e.g., as described below.

In some demonstrative aspects, message processor 128 may include, or may be implemented, partially or entirely, by circuitry and/or logic, e.g., one or more processors including circuitry and/or logic, memory circuitry and/or logic. Additionally or alternatively, one or more functionalities of message processor 128 may be implemented by logic, which may be executed by a machine and/or one or more processors, e.g., as described below.

In some demonstrative aspects, at least part of the functionality of message processor 128 may be implemented as part of information processor 196.

In other aspects, the functionality of message processor 128 may be implemented as part of any other element of device 102.

In some demonstrative aspects, at least part of the functionality of information processor 196 and/or message processor 128 may be implemented by an integrated circuit, for example, a chip, e.g., a System on Chip (SoC). In one example, the chip or SoC may be configured to perform one or more functionalities of information processor 196, and one or more functionalities of message processor 128. In one example, information processor 196 and message processor 128 may be implemented as part of the chip or SoC.

In other aspects, information processor 196 and/or message processor 128 may be implemented by one or more additional or alternative elements of device 102.

In some demonstrative aspects, device 102 may include one or more Physical Layer (PHY) chains 120 configured to communicate RF signals, for example, RF radar signals and/or RF wireless communication signals.

In some demonstrative aspects, PHY chains 120 may include RF elements, RF circuitry and/or RF logic; baseband elements, circuitry and/or logic; modulation elements, circuitry and/or logic; demodulation elements, circuitry and/or logic; amplifiers; analog to digital and/or digital to analog converters; filters; and/or the like.

In some demonstrative aspects, device 102 may include one or more antennas 107 connected to the one or more PHY chains 120, e.g., as described below.

In some demonstrative aspects, the one or more antennas 107 may include, or may be implemented by, a Multiple-Input-Multiple-Output (MIMO) antenna, for example, a MIMO radar antenna and/or a MIMO wireless communication antenna e.g., as described below. In other aspects, the one or more antennas 107 may include, or may be implemented by, any other type of antenna.

In one example, antennas 107 may include or may be part of any type of antennas suitable for transmitting and/or receiving radar signals and/or wireless communication signals. For example, antennas 107 may be implemented as part of any suitable configuration, structure, and/or arrangement of one or more antenna elements, components, units, assemblies, and/or arrays. For example, antennas 107 may be implemented as part of a phased array antenna, a multiple element antenna, a set of switched beam antennas, and/or the like. In some aspects, antennas 107 may be implemented to support transmit and receive functionalities using separate and/or different transmit antenna elements and receive antenna elements. In some aspects, antennas 107 may be implemented to support transmit and receive functionalities using common and/or integrated transmit/receive elements.

In some demonstrative aspects, information processor 196 may be configured to generate radar information, for example, based on radar signals communicated by the plurality of PHY chains 120 via the plurality of antennas 107, for example, in case device 102 is implemented as part of, or includes, a radar device, e.g., as described below.

In some demonstrative aspects, information processor 196 may be configured to process wireless communication signals communicated by the plurality of PHY chains 120 via the plurality of antennas 107, for example, in case device 102, is implemented as part of, or includes, a wireless communication device.

In some demonstrative aspects, device 102 may include at least one Local Oscillator (LO) generator 130 configured to generate an LO signal 142, e.g., as described below.

In some demonstrative aspects, LO generator 130 may be implemented as a separate element of device 102, e.g., which may be external to and/or separate from the PHY chains 120. For example, one or more PHY chains 120 may utilize an LO signal 125, which may include, or may be based on, LO signal 142, e.g., as described below.

In one example, LO signal 142 be applied, for example, over an off-board LO distribution, e.g., in an implementation where LO signal 142 is generated and/or modulated outside of and/or separate from, PHY chains 120.

In some demonstrative aspects, LO generator 130 may be implemented as part of a PHY chain 120.

In some demonstrative aspects, a PHY chain 120 may include one or more PHY elements, which may be driven by an LO clock signal, which may be based, for example, on the LO signal 125, e.g., as described below.

In some demonstrative aspects, a PHY chain 120 may include an RF chain 134, which may include one or more RF elements configured to communicate RF signals, for example, based on the LO signal 125, e.g., as described below.

In some demonstrative aspects, for example, the RF chain 134 may include, for example, modulation elements, circuitry and/or logic; demodulation elements, circuitry and/or logic; amplifiers; analog to digital and/or digital to analog converters; filters, and the like.

In some demonstrative aspects, the RF signals may include wireless communication signals, for example, in an implementation where device 102 includes a wireless communication device.

In some demonstrative aspects, the RF signals may include radar signals, for example, in an implementation where device 102 includes a radar.

In some demonstrative aspects, RF chain 134 may include a frequency mixer 132, which may be driven by an LO clock signal, which may be based on the LO signal 125, e.g., as described below.

In some demonstrative aspects, the frequency mixer 132 may be driven by an LO clock signal having a relatively high frequency, e.g., as described below.

In some demonstrative aspects, the frequency mixer 132 may be driven by an LO clock signal having a frequency above 10 Gigahertz (GHz), for example, a frequency between 10 GHz and 120 GHz. For example, the frequency mixer 125 may be driven by an LO clock signal having a frequency above 30 GHz, for example, above 45 GHz, e.g., above 60 GHz.

In one example, the frequency mixer 132 may be driven by an LO clock signal having a frequency between 76 GHz and 81 GHz, e.g., to support an implementation of automotive radar, and/or any other implementation.

In another example, the frequency mixer 132 may be driven by an LO clock signal having a frequency above 45 GHz, e.g., to support an implementation of wireless communication over a mmWave frequency band.

In other aspects, the frequency mixer 132 may be driven by an LO clock signal having any other frequency band and/or range.

In some demonstrative aspects, there may be a need to provide a technical solution to generate an LO clock signal having a relatively high frequency, e.g., above 10 GHz.

In some demonstrative aspects, device 102 may include a frequency multiplier 140, which may be configured to generate LO signal 125, for example, by multiplying a frequency of LO signal 142 by a factor greater than one.

In other aspects, device 102 may exclude the frequency multiplier 140. For example, the LO signal 142 may be provided to the PHY chains 120 as LO signal 125, e.g., directly. For example, the LO signal 125 may include, or may be substantially equal to the LO signal 142.

In some demonstrative aspects, LO generator 130 may be configured to provide a technical solution to address phase noise of LO signals, for example, phase noise of LO signal 142 and/or LO signal 125, e.g., as described below.

For example, performance of a system, e.g., system 101, may be affected by phase noise. In one example, phase noise may be one of the most critical parameters, which may affect performance of a system, e.g., a radar system and/or a wireless communication system.

For example, an LO generator with a relatively low-phase noise may be utilized to generate a frequency signal, which may then be multiplied, e.g., by an arbitrary ratio, to provide a fundamental frequency, for example, for transmit and/or receive chains of an mmWave radar system and/or an mmWave wireless communication system. The frequency multiplication may increase the phase noise of the LO, for example, by a factor of 20*log(N), and may set a noise floor for sensitivity of detection.

In some demonstrative aspects, LO generator 130 may be configured to provide the LO signal 142 having relatively low phase noise, e.g., ultra-low phase noise, as described below.

In some demonstrative aspects, LO generator 130 may be configured to provide a technical solution to support generation of the LO signal 142 having relatively low phase noise, e.g., ultra-low phase noise, for example, with reduced and/or acceptable design complexity and/or cost, e.g., as described below.

In some demonstrative aspects, for example, in some use cases, implementations and/or scenarios, there may be a need to address one or more technical challenges of an LO generation mechanism based on a combination of LO sources.

For example, a non-coherent combining approach may be based on a combination of frequency signals generated by a plurality of non-coherent oscillators. For example, the non-coherent combining approach may be utilized to improve the phase noise, e.g., by up to 10*log(m), wherein m denotes a number of the oscillators being combined. However, combining oscillators with very low phase noise may be challenging and/or may require complex structures and/or additional circuitry.

For example, the non-coherent combining approach may be implemented using two uncorrelated LO sources, which may be multiplied, e.g., via a frequency upconverter, and then divided by two, for example, to restore a fundamental frequency. For example, multiplying the two uncorrelated LO sources may result in adding the frequency signals of the uncorrelated LO sources in-phase, for example, while the noise of the two LO sources is not added in-phase. This approach may provide a theoretical phase noise improvement, e.g., of about 3 decibel (dB).

For example, this implementation of the non-coherent combining approach may require additional components, e.g., the frequency upconverter and the divider, which may add their own noise to the system, thus limiting the theoretical noise improvement of this scheme.

In one example, a high frequency up-converter may utilize at least two transformers, e.g., for input matching, and/or a transformer for output matching, e.g., to ensure optimal phase noise performance. An implementation utilizing these transformers may have a large die area, and thus may reduce an area-utilization level.

In another example, an up-converter mixer may be driven with high amplitudes, which may use additional buffers, for example, to achieve improved phase noise performance of the frequency upconverter. This implementation may have a relatively high overall power consumption.

In another example, the frequency upconverter may output other products of the frequency signal, which might interfere with other system components and/or violate emission regulations.

In some demonstrative aspects, LO generator 130 may be configured to generate the LO signal 142, for example, using a plurality of frequency sources (LO sources) 171, e.g., as described below.

In some demonstrative aspects, LO generator 130 may be configured to provide a technical solution to support generation of the LO signal 142, for example, with an improved phase noise level, e.g., as described below.

In some demonstrative aspects, LO generator 130 may be configured to provide a technical solution to support generation of the LO signal 142, for example, while using a reduced amount, e.g., even a minimal amount, of circuitry, for example, while excluding transformer, matching network, and/or buffer components, e.g., as described below.

In some demonstrative aspects, LO generator 130 may be configured to provide a technical solution to support generation of the LO signal 142, for example, even without substantial compromise on performance, e.g., as described below.

In some demonstrative aspects, LO generator 130 may include a plurality of frequency sources 171, which may be configured to provide a respective plurality of frequency source signals 172, for example, according to a first frequency, e.g., as described below.

In some demonstrative aspects, LO generator 130 may include an Injection-Locked Frequency Divider (ILFD) 173, which may be configured to provide the LO signal 142 having a second frequency, e.g., as described below.

In some demonstrative aspects, injection-locked frequency divider 173 may be configured as a divider-by-n, which may be configured to generate the second frequency, e.g., of LO signal 142, for example, based on the first frequency, e.g., of frequency source signals 172, divided by a number, dented n (also referred to as the "division ratio n"). For example, the number n may be an odd integer greater than 1, e.g., as described below.

In some demonstrative aspects, injection-locked frequency divider 173 may be configured as a divider-by-3, which may be configured to generate the second frequency, e.g., of LO signal 142, for example, based on the first frequency, e.g., of frequency source signals 172, divided by three, e.g., n=3, as described below.

In other aspects, any other odd integer value may be implemented for the division ratio n.

In some demonstrative aspects, the injection-locked frequency divider 173 may include a plurality of injection paths 177, which may be configured to inject the plurality of frequency source signals 172 into an injection-locked Ring Oscillator (RO) 179, e.g., as described below.

In some demonstrative aspects, a frequency source 171 of the plurality of frequency sources 171 may include a Digital Phase Locked Loop (DPLL), e.g., as described below.

In other aspects, the plurality of frequency sources 171 may include any other type of frequency sources.

In some demonstrative aspects, the plurality of frequency sources 171 may be uncorrelated with one another, e.g., as described below.

In some demonstrative aspects, LO generator 130 may be configured to generate the LO signal 142 having a phase noise, which may be lower than a phase noise of the frequency source signals 172, e.g., as described below.

For example, a frequency source signal 172 may have a first phase noise, and the LO signal 142 may have a second phase noise, which may be lower than the first phase noise of the frequency source signal 172, e.g., as described below.

In some demonstrative aspects, LO generator 130 may be configured to generate the LO signal 142 having a phase noise, which may be lower than a phase noise of the frequency source signals 172, for example, by a factor of about 10 log(m), wherein m denotes a count of frequency sources in the plurality of frequency sources 171, e.g., as described below.

In other aspects, LO generator 130 may be configured to generate the LO signal 142 with any other level of phase noise.

In some demonstrative aspects, the plurality of frequency sources 171 may include a first frequency source 171 to provide a first frequency source signal 172, for example, according to the first frequency, and a second frequency source 171 to provide a second frequency source signal 172, for example, according to the first frequency, e.g., as described below.

In some demonstrative aspects, the injection-locked frequency divider 173 may include a first injection path 177 to inject the first frequency source signal 172 into a first inverter stage of the injection-locked RO 179, and a second injection path 177 to inject the second frequency source signal 172 into a second inverter stage of the injection-locked RO 179, e.g., as described below.

In some demonstrative aspects, a count of injection paths 177 in the plurality of injection paths of injection-locked RO 179 may be equal to a count of frequency sources in the plurality of frequency sources 172, e.g., as described below.

In some demonstrative aspects, the plurality of injection paths 177 may be configured to respectively inject the plurality of frequency source signals 172 into the injection-locked RO 179, e.g., as described below.

In some demonstrative aspects, a count of injection paths 177 in the plurality of injection paths of injection-locked RO 179 may be greater than a count of frequency sources in the plurality of frequency sources 172, e.g., as described below.

In some demonstrative aspects, two or more injection paths 177 may be configured to inject a same frequency source signal 172 into the injection-locked RO 179, e.g., as described below.

In some demonstrative aspects, an injection path 177 of the plurality of injection paths 177 may include a plurality of injection-locking transistors, e.g., injection locking latches, which may be, for example, connected in series to an inverter stage of the injection-locked RO 179, e.g., as described below.

In some demonstrative aspects, the plurality of injection-locking transistors of the injection path 177 may be controllable, for example, according to a frequency source signal 172 of the plurality of frequency source signals 172, e.g., as described below.

In some demonstrative aspects, device 102 may include a controller 174, which may be configured to control a phase of at least one frequency source signal 172 of the plurality of frequency source signals 172, for example, based on an amplitude of the LO signal 142, e.g., as described below.

In some demonstrative aspects, controller 174 may be configured to control a phase difference between at least first and second frequency source signals 172 of the plurality of frequency source signals 172, for example, based on the amplitude of the LO signal 142, e.g., as described below.

In some demonstrative aspects, a fundamental frequency of the injection-locked RO 179 may be based, for example, on an equivalent delay between two successive stages of the injection-locked RO 179. This equivalent delay may be dominated, for example, by an output resistance of the stages, and an equivalent capacitance of an input stage of the injection-locked RO 179. For example, a free running frequency of the injection-locked RO 179 may be based on the equivalent delay.

In some demonstrative aspects, the plurality of frequency sources 171 may be configured as "external" local-oscillators, which may be used to lock the injection-locked RO 179 at the division ratio n. The locking of the injection-locked RO 179 may effectively result in frequency division of the first frequency e.g., of the "eternal" local oscillator signals 172, while scaling noise by a factor of about −20 log(N).

In some demonstrative aspects, the plurality of frequency sources 171 may be implemented utilizing two or more uncorrelated external frequency sources, for example, to provide a technical solution to improve an overall phase noise. For example, the improvement of the overall phase noise may be achieved, for example, since the fundamental signal may be added in phase, while the phase noise of the different external oscillators may be added with arbitrary phase. Accordingly, an overall phase noise may be improved, for example, by a factor of about 10 log(m), wherein m denotes a count of the uncorrelated frequency sources, e.g., a count of frequency sources 171.

In some demonstrative aspects, LO generator 130 may be configured to provide a technical solution to support generation of LO signal 142, for example, using an LO generation architecture having a small form factor.

In some demonstrative aspects, LO generator 130 may be configured to provide a technical solution to support generation of LO signal 142, for example, using an LO generation architecture having relatively low, e.g., considerably low, power consumption, e.g., compared to other alternatives.

In some demonstrative aspects, LO generator 130 may be configured to provide a technical solution to support generation of LO signal 142, for example, using an LO generation architecture, which may provide natural scaling to m frequency sources 171.

In some demonstrative aspects, LO generator 130 may be configured to provide a technical solution to support generation of LO signal 142, for example, with a theoretical improvement in the phase noise by about 10 log(m), e.g., based on the number m of uncorrelated frequency sources 171.

In some demonstrative aspects, LO generator 130 may be configured to provide a technical solution to generate LO signal 142, for example, while supporting dynamic control of the phase noise of LO signal 142, for example, using a same LO generation architecture.

In some demonstrative aspects, the architecture of LO generator 130 may support quick, efficient, and/or easy switching between different numbers of LO sources 171, which may be used to drive the injection-locked frequency divider 173.

Figure 2:
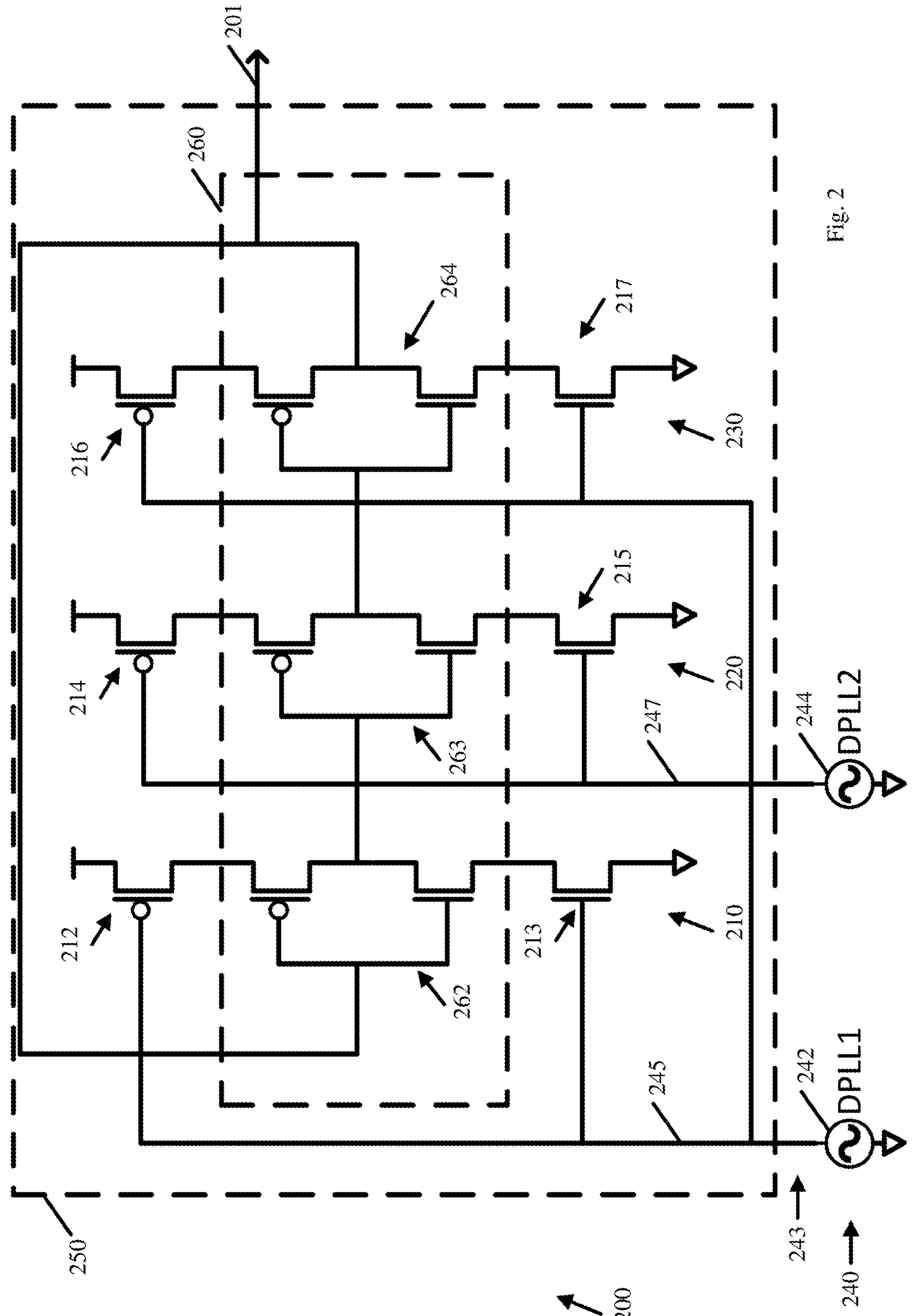
FIG. 2 is a schematic illustration of a Local Oscillator (LO) generator, in accordance with some demonstrative aspects.

Reference is made to FIG. 2, which schematically illustrates an LO generator 200, in accordance with some demonstrative aspects. For example, LO generator 130 (FIG. 1) may include one or more elements of LO generator 200, and/or may perform one or more operations and/or functionalities of LO generator 200.

In some demonstrative aspects, as shown in FIG. 2, LO generator 200 may include a plurality of frequency sources 240, which may be configured to provide a respective plurality of frequency source signals 243, for example, according to a first frequency, e.g., as described below. For example, frequency sources 171 (FIG. 1) may include one or more elements of frequency sources 240, and/or may perform one or more operations and/or functionalities of frequency sources 240. For example, frequency source signals 172 (FIG. 1) may include frequency source signals 243.

In some demonstrative aspects, as shown in FIG. 2, LO generator 200 may include an injection-locked frequency divider 250, which may be configured to provide an LO signal 201 having a second frequency, e.g., as described below. For example, injection-locked frequency divider 173 (FIG. 1) may include one or more elements of injection-locked frequency divider 250, and/or may perform one or more operations and/or functionalities of injection-locked frequency divider 250. For example, LO signal 142 (FIG. 1) may include LO signal 201.

In some demonstrative aspects, injection-locked frequency divider 250 may be configured as a divider-by-n, which may be configured to generate the second frequency, e.g., of LO signal 201, for example, based on the first frequency, e.g., of frequency source signals 243, divided by the division ratio n. For example, the division ratio n may be an odd integer greater than 1, e.g., as described below.

In some demonstrative aspects, injection-locked frequency divider 250 may be configured as a divider-by-3, e.g., as described below.

In some demonstrative aspects, injection-locked frequency divider 250 may be configured to generate the second frequency, e.g., of LO signal 201, for example, based on the first frequency, e.g., of frequency source signals 243, divided by three, e.g., as described below.

In some demonstrative aspects, the first frequency, e.g., of the plurality of frequency source signals 243, may be based on a multiple of the second frequency, denoted $\omega_0$, to be provided for the LO signal 201, e.g., as described below.

In some demonstrative aspects, the first frequency may be based on a product of the second frequency $\omega_0$ multiplied by the division ratio n, e.g., $n*\omega_0$.

In some demonstrative aspects, the first frequency may include a frequency, e.g., $3\omega_0$, which is three times the second frequency $\omega_0$, for example, for an implementation of a divider-by-3 injection-locked frequency divider 250, e.g., as described below.

In other aspects, injection-locked frequency divider 250 may be configured according to any other division ratio n.

In some demonstrative aspects, the plurality of frequency sources 240 may include a first frequency source 242 to provide a first frequency source signal 245, for example, according to the first frequency $3\omega_0$, and a second frequency source 244 to provide a second frequency source signal 247, for example, according to the first frequency $3\omega_0$, e.g., as described below.

In some demonstrative aspects, frequency source 242 may include a first DPLL, and/or frequency source 244 may include a second DPLL, e.g., as described below. In other aspects, any other type of frequency source may be implemented.

In some demonstrative aspects, the plurality of frequency sources 240 may be uncorrelated with one another, e.g., as described below. For example, frequency source 242 may be uncorrelated with the frequency source 244.

In some demonstrative aspects, the plurality of frequency sources 240 may have different and/or uncorrelated phase noise. For example, frequency source 242 may have a first phase noise, and frequency source 244 may have a second phase noise, which may be uncorrelated with, and/or different from, the first phase noise.

In some demonstrative aspects, the injection-locked frequency divider 250 may include a plurality of injection paths, which may be configured to inject the plurality of frequency source signals 243 into an injection-locked RO 260, e.g., as described below. For example, injection-locked RO 179 (FIG. 1) may include one or more elements of injection-locked RO 260, and/or may perform one or more operations and/or functionalities of injection-locked RO 260.

For example, as shown in FIG. 2, the injection-locked frequency divider 250 may include a first path 210, a second path 220, and a third path 230, which may be configured to inject the plurality of frequency source signals 243 into an injection-locked RO 260, e.g., as described below.

In some demonstrative aspects, as shown in FIG. 2, a count of the injection paths of injection-locked frequency divider 250 may be greater than the count of frequency sources 240.

For example, as shown in FIG. 2, LO generator 200 may include two frequency sources 240, e.g., the frequency sources 242 and 244, while the injection-locked frequency divider 250 may include three injection paths, e.g., injection paths 210, 220 and 230.

In some demonstrative aspects, as shown in FIG. 2, two or more injection paths of injection-locked frequency divider 250 may be configured to inject a same frequency source signal into the injection-locked RO 260, e.g., as described below.

For example, as shown in FIG. 2, frequency source signal 245 may be provided to both the injection paths 210 and 230, for example, such that both injection paths 210 and 230 may inject the same frequency source signal 245 into the injection-locked RO 260.

In some demonstrative aspects, as shown in FIG. 2, the injection path 210 may be configured to inject the frequency source signal 245 into a first inverter stage 262 of the injection-locked RO 260.

In some demonstrative aspects, as shown in FIG. 2, the injection path 220 may be configured to inject the frequency source signal 247 into a second inverter stage 263 of the injection-locked RO 260.

In some demonstrative aspects, as shown in FIG. 2, the injection path 220 may be configured to inject the frequency source signal 245 into a third inverter stage 264 of the injection-locked RO 260.

In some demonstrative aspects, as shown in FIG. 2, injection path 210 may include a plurality of injection-locking transistors, e.g., including an injection-locking transistor 212 and an injection-locking transistor 213, which may be connected in series to inverter stage 262.

In some demonstrative aspects, as shown in FIG. 2, injection path 220 may include a plurality of injection-locking transistors, e.g., including an injection-locking transistor 214 and an injection-locking transistor 215, which may be connected in series to inverter stage 263.

In some demonstrative aspects, as shown in FIG. 2, injection path 230 may include a plurality of injection-locking transistors, e.g., including an injection-locking transistor 216 and an injection-locking transistor 217, which may be connected in series to inverter stage 264.

For example, injection-locking transistors 212, 213, 214, 215, 216, and/or 217 may be implemented in the form of one or more injection locking latches.

In some demonstrative aspects, as shown in FIG. 2, the plurality of injection-locking transistors of the injection path 210, e.g., injection-locking transistors 212 and 213, may be controllable, for example, according to frequency source signal 245.

In some demonstrative aspects, as shown in FIG. 2, the plurality of injection-locking transistors of the injection path 220, e.g., injection-locking transistors 214 and 215, may be controllable, for example, according to frequency source signal 247.

In some demonstrative aspects, as shown in FIG. 2, the plurality of injection-locking transistors of the injection path 230, e.g., injection-locking transistors 216 and 217, may be controllable, for example, according to frequency source signal 245.

In some demonstrative aspects, LO generator 200 may be configured to generate the LO signal 201 having a phase noise, which may be lower than a phase noise of the frequency source signals 243, e.g., as described below. For example, LO generator 200 may be configured to generate the LO signal 201 having have a phase noise, which may be lower than the phase noise of the frequency source signal 245 and/or the phase noise of the frequency source signal 247, e.g., as described below.

In some demonstrative aspects, LO generator 200 may be configured to generate the LO signal 201 having a phase noise, which may be lower than a phase noise of the frequency source signals 243, for example, by about a factor of 10 log(2), e.g., in case frequency sources 240 include two frequency sources.

In other aspects, LO generator 200 may be configured to generate the LO signal 201 with any other level of phase noise.

Figure 3:
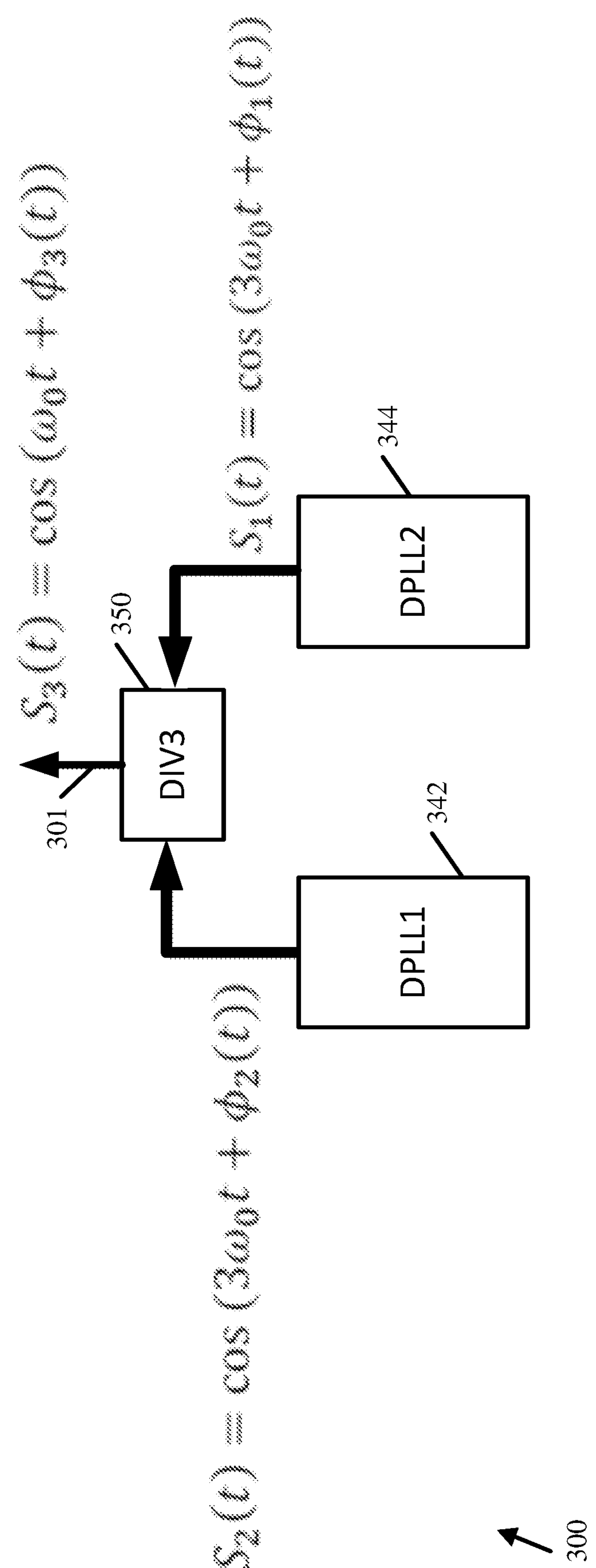
FIG. 3 is a schematic illustration of signals generated according to an LO generation scheme, in accordance with some demonstrative aspects.

Reference is made to FIG. 3, which schematically illustrates signals generated according to an LO generation scheme 300, in accordance with some demonstrative aspects. For example, LO generator 200 (FIG. 2) may be configured to generate LO signal 210 (FIG. 2) according to the LO generation scheme 300.

In some demonstrative aspects, as shown in FIG. 3, LO generation scheme 300 may be configured to generate an LO signal 301 having a frequency (operating frequency) ωo.

In some demonstrative aspects, as shown in FIG. 3, LO generation scheme 300 may include two frequency sources, for example, including a first frequency source 342 and a second frequency source 344. In one example, frequency source 242 (FIG. 2) may include and/or may perform one or more operations and/or functionalities of frequency source 342, and/or frequency source 244 (FIG. 2) may include and/or may perform one or more operations and/or functionalities of frequency source 344.

In some demonstrative aspects, frequency sources 342 and 344 may be implemented by two respective uncorrelated LO sources, e.g., two uncorrelated DPLLs.

In some demonstrative aspects, as shown in FIG. 3, frequency sources 342 and 344 may be configured to operate at a fundamental frequency, which may be, for example, about 3 times higher than the operating frequency $\omega_0$.

In some demonstrative aspects, as shown in FIG. 3, the frequency source 344 may generate a first frequency source signal, denoted $S_1(t)$, for example, having a frequency $3*\omega_0$ and a first phase noise, denoted $\varphi_1(t)$, for example, $S_1(t)=\cos(3*\omega_0 t+\varphi_1(t))$.

In some demonstrative aspects, as shown in FIG. 3, the frequency source 342 may generate a second frequency source signal, denoted $S_2(t)$, for example, having a frequency $3*\omega_0$ and a second phase noise, denoted $\varphi_2(t)$, for example, $S_2(t)=\cos(3*\omega_0 t+\varphi_2(t))$.

In some demonstrative aspects, as shown in FIG. 3, LO generation scheme 300 may include a divider-by 3 cell 350, which may be configured to provide the LO signal 301 based on the frequency source signals $S_1(t)$ and $S_2(t)$. In one example, divider-by 3 cell 350 may include one or more elements of injection-locked frequency divider 250 (FIG. 2), and/or may perform one or more operations and/or functionalities of injection-locked frequency divider 250 (FIG. 2).

In some demonstrative aspects, as shown in FIG. 3, the divider-by 3 cell 350 may be configured to provide the LO signal 301 with the output frequency $\omega_0$, e.g., by dividing the frequency $3*\omega_0$ of the frequency source signals $S_1(t)$ and $S_2(t)$.

In some demonstrative aspects, as shown in FIG. 3, the divider-by 3 cell 350 may be configured to provide the LO signal 301, denoted $S_3(t)$, for example, having the frequency $\varphi_0$ and a third phase noise, denoted $\varphi_3(t)$, for example, $S_3(t)=\cos(\omega_0 t+\varphi_3(t))$.

In some demonstrative aspects, the LO generation scheme 300 may be implemented utilizing uncorrelated frequency sources 342 and 344, e.g., wherein the phase noises $\varphi_1(t)$ and $\varphi_2(t)$ are uncorrelated.

In some demonstrative aspects, implementing the LO generation scheme 300 utilizing uncorrelated frequency sources 342 and 344 may provide a technical solution to generate the LO signal 301 with reduced phase noise $\varphi_3(t)$.

For example, the phase noise $\varphi_3(t)$, e.g., when utilizing uncorrelated frequency sources 342 and 344, may be lower by a factor of about 10 log(2), e.g., compared to a case where the phase noises $\varphi_1(t)$ and $\varphi_2(t)$ are correlated.

For example, the phase noise $\varphi_3(t)$ may be based on a combination of the phase noises $\varphi_1(t)$ and $\varphi_2(t)$. For example, the phase noise $\varphi_3(t)$ may be based on the sum $\theta(t)=\varphi_1(t)+\varphi_2(t)$.

For example, the phase noise $\varphi_3(t)$ may be based on the autocorrelation of the phase noises $\varphi_1(t)$ and $\varphi_2(t)$, e.g., as follows:

$$R(\theta(t,\tau)) = E\{\theta(t+\tau)\theta(\tau)\} = E\{[\phi_1(t+\tau)+\phi_2(t+\tau)][\phi_1(\tau)+\phi_2(\tau)]\} = E\{\phi_1(t+\tau)\phi_1(\tau)\} + E\{\phi_1(t+\tau)\}E\{\phi_2(t)\} + E\{\phi_2(t+\tau)\}E\{\phi_1(\tau)\} + E\{\phi_1(t+\tau)\phi_2(\tau)\} = \mathrm{Var}(\phi_1(t)) + \mathrm{Var}(\phi_2(t)) + 2\mu_1\mu_2$$

wherein $\mu_1\mu_2=E\{\phi_1(t+\tau)\}E\{\phi_2(t)\}$denotes the cross correlation between the phase noise components $\varphi_1(t)$ and $\varphi_2(t)$.

For example, in case that the phase noises $\varphi_1(t)$ and $\varphi_2(t)$ are correlated, and $\varphi_1(t)=\varphi_2(t)$ the phase noise $\varphi_3(t)$ may be based on:

$$R_{corr}(\theta(t,\tau)) = \mathrm{Var}(\phi_1(t)) + \mathrm{Var}(\phi_2(t)) + 2\mu_1\mu_2 = 4\mathrm{Var}(\phi_1(t)) = 4\phi_{1,rms}^2 \quad (2)$$

wherein $\phi_{1,rms}$ denotes an integrate phase noise power.

For example, in case that the phase noises $\varphi_1(t)$ and $\varphi_2(t)$ are uncorrelated, the cross product $\mu_1\mu_2$ is equal to zero. Accordingly, the phase noise $\varphi_3(t)$ may be based on:

$$R_{uncorr}(\theta(t,\tau)) = \mathrm{Var}(\phi_1(t)) + \mathrm{Var}(\phi_2(t)) = 2\mathrm{Var}(\phi_1(t)) = 2\phi_{1,rms}^2 \quad (3)$$

For example, a phase noise factor when implementing uncorrelated frequency sources 342 and 344 may be determined, e.g., as follows:

$$\text{Phase Noise Factor} = 10*\log\frac{4\phi_{1,rms}^2}{2\phi_{1,rms}^2} = 3\text{ dB} \quad (4)$$

For example, a similar calculation may be performed to determine a phase noise factor for an LO generation scheme 300 implementing m uncorrelated frequency sources. For example, the phase noise factor for an LO generation scheme 300 implementing m uncorrelated frequency sources may be about 10 log(m).

Figure 4:
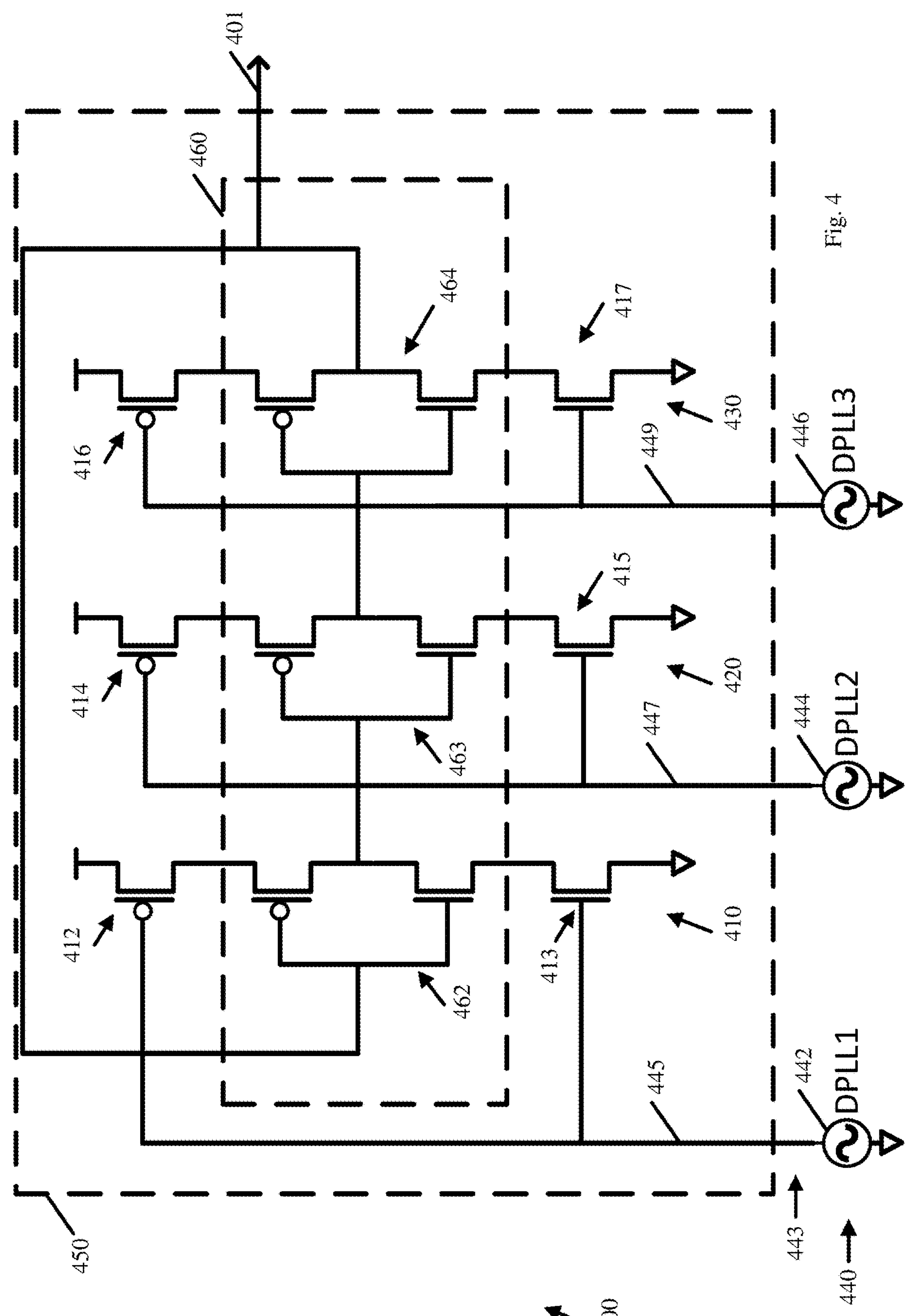
FIG. 4 is a schematic illustration of an LO generator, in accordance with some demonstrative aspects.

Reference is made to FIG. 4, which schematically illustrates an LO generator 400, in accordance with some demonstrative aspects. For example, LO generator 130 (FIG. 1) may include one or more elements of LO generator 400, and/or may perform one or more operations and/or functionalities of LO generator 400.

In some demonstrative aspects, as shown in FIG. 4, LO generator 400 may include a plurality of frequency sources 440, which may be configured to provide a respective plurality of frequency source signals 443, for example, according to a first frequency, e.g., as described below. For example, frequency sources 171 (FIG. 1) may include one or more elements of frequency sources 440, and/or may perform one or more operations and/or functionalities of frequency sources 440. For example, frequency source signals 172 (FIG. 1) may include frequency source signals 443.

In some demonstrative aspects, as shown in FIG. 4, LO generator 400 may include an injection-locked frequency divider 450, which may be configured to provide an LO signal 401 having a second frequency, e.g., as described below. For example, injection-locked frequency divider 173 (FIG. 1) may include one or more elements of injection-locked frequency divider 450, and/or may perform one or more operations and/or functionalities of injection-locked frequency divider 450. For example, LO signal 142 (FIG. 1) may include LO signal 401.

In some demonstrative aspects, injection-locked frequency divider 450 may be configured as a divider-by-n, which may be configured to generate the second frequency, e.g., of LO signal 401, for example, based on the first frequency, e.g., of frequency source signals 443, divided by the division ratio n. For example, the division ratio n may be an odd integer greater than 1, e.g., as described below.

In some demonstrative aspects, injection-locked frequency divider 450 may be configured as a divider-by-3, e.g., as described below.

In some demonstrative aspects, injection-locked frequency divider 450 may be configured to generate the second frequency, e.g., of LO signal 401, for example, based on the first frequency, e.g., of frequency source signals 443, divided by three, e.g., as described below.

In some demonstrative aspects, the first frequency, e.g., of the plurality of frequency source signals 443, may be based on a multiple of the second frequency $\omega_0$, to be provided for the LO signal 401, e.g., as described below.

In some demonstrative aspects, the first frequency may be based on a product of the second frequency $\omega_0$ multiplied by the division ratio n, e.g., $n^*\omega_0$.

In some demonstrative aspects, the first frequency may include a frequency, e.g., $3\omega_0$, which is three times the second frequency $\omega_0$, for example, for an implementation of a divider-by-3 injection-locked frequency divider 450, e.g., as described below.

In other aspects, injection-locked frequency divider 450 may be configured according to any other division ratio n.

In some demonstrative aspects, the plurality of frequency sources 440 may include a first frequency source 442 to provide a first frequency source signal 445, for example, according to the first frequency $3\omega_0$, a second frequency source 444 to provide a second frequency source signal 447, for example, according to the first frequency $3\omega_0$, and a third frequency source 446 to provide a third frequency source signal 449, for example, according to the first frequency $3\omega_0$, e.g., as described below.

In some demonstrative aspects, frequency source 442 may include a first DPLL, frequency source 444 may include a second DPLL, and/or frequency source 446 may include a third DPLL e.g., as described below. In other aspects, any other type of frequency source may be implemented.

In some demonstrative aspects, the plurality of frequency sources 440 may be uncorrelated with one another, e.g., as described below. For example, frequency source 442, frequency source 444 and frequency source 446 may be uncorrelated with one another.

In some demonstrative aspects, the plurality of frequency sources 440 may have different and/or uncorrelated phase noise. For example, frequency source 442 may have a first phase noise, frequency source 444 may have a second phase noise, which may be uncorrelated with, and/or different from, the first phase noise, and frequency source 446 may have a third phase noise, which may be uncorrelated with, and/or different from, the first and second phase noises.

In some demonstrative aspects, the injection-locked frequency divider 450 may include a plurality of injection paths, which may be configured to inject the plurality of frequency source signals 443 into an injection-locked RO 460, e.g., as described below. For example, injection-locked RO 179 (FIG. 1) may include one or more elements of injection-locked RO 460, and/or may perform one or more operations and/or functionalities of injection-locked RO 460.

For example, as shown in FIG. 4, the injection-locked frequency divider 450 may include a first path 410, a second path 420, and a third path 430, which may be configured to inject the plurality of frequency source signals 443 into an injection-locked RO 460, e.g., as described below.

In some demonstrative aspects, as shown in FIG. 4, the count of frequency sources 440 may be equal to a count of the injection paths of injection-locked frequency divider 450.

For example, as shown in FIG. 4, LO generator 400 may include three frequency sources 440, e.g., the frequency sources 442, 444 and 446, and the injection-locked frequency divider 450 may include three injection paths, e.g., injection paths 410, 420 and 430.

In some demonstrative aspects, the plurality of injection paths of injection-locked frequency divider may be configured to respectively inject the plurality of frequency source signals 443 into the injection-locked RO 460, e.g., as described below.

In some demonstrative aspects, frequency source signal 445 may be provided to injection path 410, for example, such that injection path 410 may inject the frequency source signal 445 into the injection-locked RO 460.

In some demonstrative aspects, frequency source signal 447 may be provided to injection path 420, for example, such that injection path 420 may inject the frequency source signal 447 into the injection-locked RO 460.

In some demonstrative aspects, frequency source signal 449 may be provided to injection path 430, for example, such that injection path 430 may inject the frequency source signal 449 into the injection-locked RO 460.

In some demonstrative aspects, as shown in FIG. 4, the injection path 410 may be configured to inject the frequency source signal 445 into a first inverter stage 462 of the injection-locked RO 460.

In some demonstrative aspects, as shown in FIG. 4, the injection path 420 may be configured to inject the frequency source signal 447 into a second inverter stage 463 of the injection-locked RO 460.

In some demonstrative aspects, as shown in FIG. 4, the injection path 420 may be configured to inject the frequency source signal 449 into a third inverter stage 464 of the injection-locked RO 460.

In some demonstrative aspects, as shown in FIG. 4, injection path 410 may include a plurality of injection-locking transistors, e.g., including an injection-locking transistor 412 and an injection-locking transistor 413, which may be connected in series to inverter stage 462.

In some demonstrative aspects, as shown in FIG. 4, injection path 420 may include a plurality of injection-locking transistors, e.g., including an injection-locking transistor 414 and an injection-locking transistor 415, which may be connected in series to inverter stage 463.

In some demonstrative aspects, as shown in FIG. 4, injection path 430 may include a plurality of injection-locking transistors, e.g., including an injection-locking transistor 416 and an injection-locking transistor 417, which may be connected in series to inverter stage 464.

For example, injection-locking transistors 412, 413, 414, 415, 416, and/or 417 may be implemented in the form of one or more injection locking latches.

In some demonstrative aspects, as shown in FIG. 4, the plurality of injection-locking transistors of the injection path 410, e.g., injection-locking transistors 412 and 413, may be controllable, for example, according to frequency source signal 445.

In some demonstrative aspects, as shown in FIG. 4, the plurality of injection-locking transistors of the injection path 420, e.g., injection-locking transistors 414 and 415, may be controllable, for example, according to frequency source signal 447.

In some demonstrative aspects, as shown in FIG. 4, the plurality of injection-locking transistors of the injection path 430, e.g., injection-locking transistors 416 and 417, may be controllable, for example, according to frequency source signal 449.

In some demonstrative aspects, LO generator 400 may be configured to generate the LO signal 401 having a phase noise, which may be lower than a phase noise of the frequency source signals 443, e.g., as described above. For example, LO generator 400 may be configured to generate the LO signal 401 having have a phase noise, which may be lower than the phase noise of the frequency source signal 445, the phase noise of the frequency source signal 447, and/or the phase noise of the frequency source signal 449.

In some demonstrative aspects, LO generator 400 may be configured to generate the LO signal 401 having a phase noise, which may be lower than a phase noise of the frequency source signals 443, for example, by about a factor of 10 log(3), e.g., in case frequency sources 440 include three frequency sources.

In other aspects, LO generator 400 may be configured to generate the LO signal 401 with any other level of phase noise.

Referring back to FIG. 1, in some demonstrative aspects, LO generator 130 may be configured to implement the injection-locked frequency divider 173 utilizing the frequency source signals 172 provided by the plurality of frequency sources 171, e.g., as described above.

In some demonstrative aspects, LO generator 130 may be configured to implement the plurality of frequency sources 171 including two or more uncorrelated frequency sources 171, for example, to provide a technical solution to generate LO signal 142 having a reduced level of phase noise, e.g., as described below.

In some demonstrative aspects, LO generator 130 may be configured to implement the injection-locked frequency divider 173 utilizing the two or more uncorrelated frequency sources 171, for example, to provide a technical solution to generate LO signal 142 having a reduced level of phase noise, for example, as compared to a phase noise of a signal generated by an injection-locked frequency divider utilizing a single frequency source.

For example, the LO signal 142 generated by LO generator 130 utilizing m uncorrelated frequency sources 171 may have an improved phase noise, e.g., by a factor of about 10*log(m), for example, compared to the phase noise of an LO signal generated based on a single frequency source signal.

In one example, an LO signal generated by an LO generator utilizing two uncorrelated frequency sources, e.g., LO generator 200 (FIG. 2), may have an improved phase noise, e.g., by a factor of about 10*log(2)≈3, for example, compared to the phase noise of an LO signal generated based on a single frequency source signal.

In one example, an LO signal generated by an LO generator utilizing three uncorrelated frequency sources, e.g., LO generator 400 (FIG. 4), may have an improved phase noise, e.g., by a factor of about 10*log(3)≈4.8, for example, compared to the phase noise of an LO signal generated based on a single frequency source signal.

The following table summarizes simulation results of a phase noise of an LO signal, e.g., LO signal 142, generated by an LO generator, e.g., LO generator 130, including an injection-locked frequency divider, e.g., injection-locked frequency divider 173, fed by 1, 2, or 3 frequency source signals:

TABLE 1

| Relative Frequency (Hz) | Phase Noise (PN) at 27 GHz [dBc/Hz] | PN based on single source at 9 GHz [dBc/Hz] | PN based on two sources at 9 GHz [dBc/Hz] | PN based on three sources at 9 GHz [dBc/Hz] |
|---|---|---|---|---|
| 10k | −65 | −74.5 | −77.5 | −78.6 |
| 100k | −94 | −103.5 | −106.5 | −107.6 |
| 1M | −117.5 | −127 | −130 | −131 |
| 10M | −138.5 | −148 | −150.8 | −151.7 |
| 100M | −159 | −164.6 | −165.7 | −168.8 |

For example, the first column of Table 1 includes relative frequency values implemented for the simulation.

For example, the second column of Table 1 includes simulated values of the phase noise of an LO signal having a frequency of 27 GHz.

For example, the third column of Table 1 includes simulated values of the phase noise generated by a divider-by-3 based on a single frequency source signal having a frequency of 9 GHz.

For example, the fourth column of Table 1 includes simulated values of the phase noise generated by a divider-by-3 based on two uncorrelated frequency source signals, each having a frequency of 9 GHz.

For example, the fifth column of Table 1 includes simulated values of the phase noise generated by a divider-by-3 based on three uncorrelated frequency source signals, each having a frequency of 9 GHz.

For example, according to the simulated results of Table 1, it may be seen that the phase noise (fourth column of Table 1) of an LO signal generated by an LO generator, e.g., LO generator 200 (FIG. 2), utilizing two uncorrelated frequency sources, may be improved, e.g., by a factor of about 10*log(2)≈3 dB, for example, compared to the phase noise (third column of Table 1) of the LO signal generated based on a single frequency source signal.

For example, according to the simulated results of Table 1, it may be seen that the phase noise (fifth column of Table 1) of an LO signal generated by an LO generator, e.g., LO generator 400 (FIG. 4), utilizing three uncorrelated frequency sources, may be improved, e.g., by a factor of about 4.1 dB, for example, compared to the phase noise (third column of Table 1) of the LO signal generated based on a single frequency source signal.

In some demonstrative aspects, different LO-sources, which are un-correlated, may have a static phase delta (phase bias), which may result, for example, in a destructive interference to the injection-locking mechanism of injection-locked frequency divider 173.

In some demonstrative aspects, a particular static phase difference, e.g., between the input LO sources of the injection-locked frequency divider, may be identified at a point where an output amplitude and/or a phase noise of the generated LO signal may collapse. For example, it may be identified, for example, based on simulation results, that a static phase delta exceeding a static phase difference threshold may result in the collapsing of the output amplitude and/or a phase noise of the generated LO signal. In one example, the static phase difference threshold may be identified to be about 105 degrees, for example, based on simulation results corresponding to a simulated configuration of an injection-locked frequency divider and a plurality of LO sources. This static phase difference threshold may change, for example, based on configuration, implementation and/or operating conditions.

In some demonstrative aspects, controller 174 may be configured to control a phase of at least one of the plurality of frequency sources 172, for example, to selectively control a static phase difference between the frequency source signals 171.

In some demonstrative aspects, controller 174 may be configured to control a phase of at least one of the plurality of frequency sources 171, for example, to monitor and/or controllably maintain the static phase difference between the frequency source signals 171, e.g., below the static phase difference threshold.

In some demonstrative aspects, controller 174 may implement a detector, e.g., an envelope detector, which may be configured to monitor an output voltage of the LO signal 142.

In some demonstrative aspects, controller 174 may be configured to detect a situation ("breaking point") where the static phase difference threshold is about to be reached, for example, based on the output voltage of the LO signal 142.

In some demonstrative aspects, controller 174 may be configured to detect the breaking point, for example, based on a comparison between the output voltage of the LO signal 142 and a voltage threshold.

In some demonstrative aspects, controller 174 may be configured to detect the breaking point, for example, based on a determination that the output voltage of the LO signal 142 falls below the voltage threshold.

In some demonstrative aspects, controller 174 may be configured to controllably change the phase of at least one of the plurality of frequency source signals 171, for example, until the output voltage of the LO signal 142 is restored a suitable working point, e.g., until a maximum output amplitude of the LO signal 142 is restored.

Figure 5:
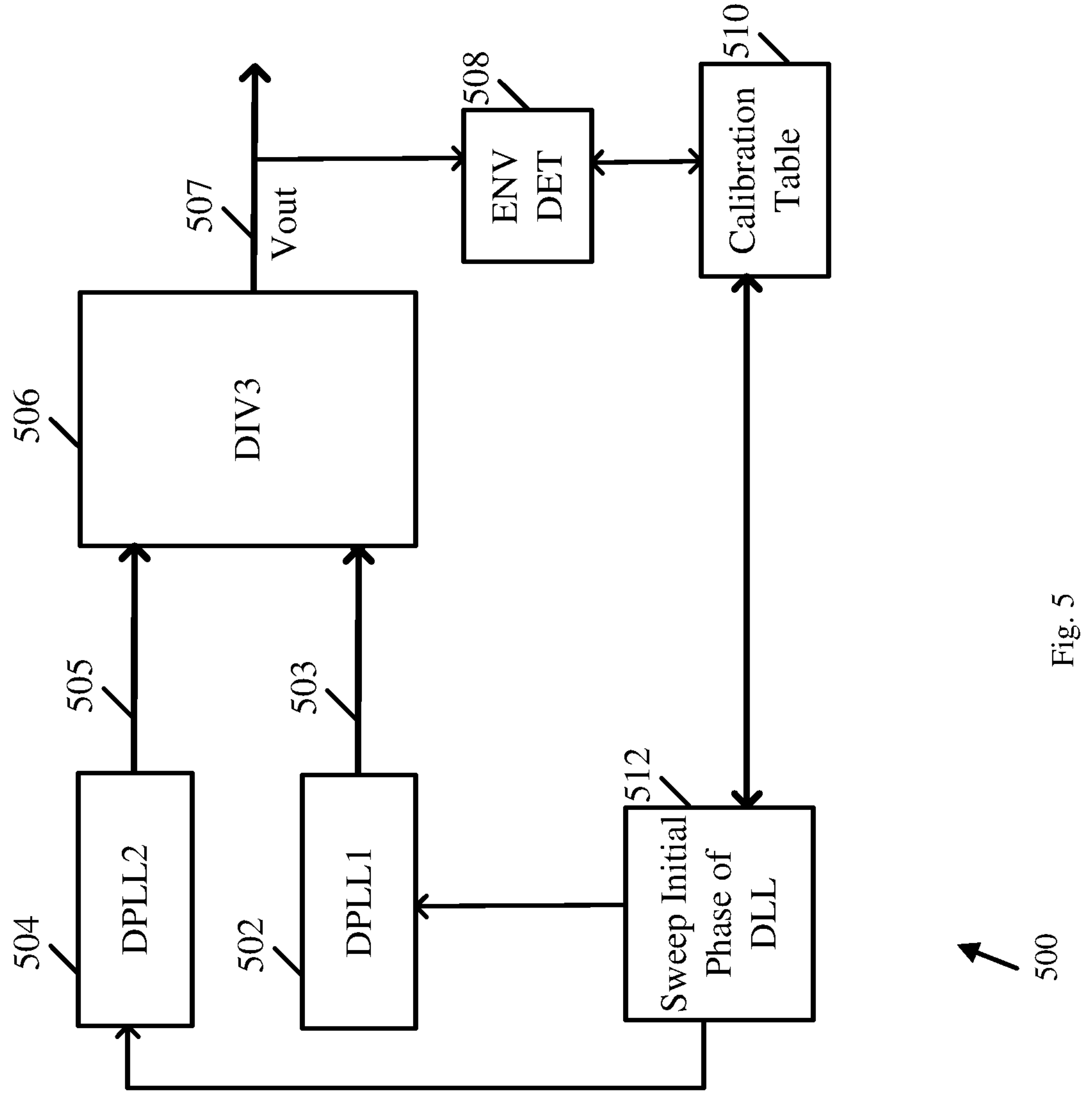
FIG. 5 is a schematic illustration of a static phase calibration scheme, in accordance with some demonstrative aspects.

Reference is made to FIG. 5, which schematically illustrates a static phase calibration scheme 500, in accordance with some demonstrative aspects. For example, controller 174 (FIG. 1) may be configured to perform one or more operations and/or functionalities according to calibration scheme 500, for example, to calibrate a static phase between the frequency sources 171 (FIG. 1).

In some demonstrative aspects, as shown in FIG. 5, an LO signal 507, may be generated by an injection-locked frequency divider 506, e.g., divider-by-3, for example, based on a frequency source signal 503 from a first frequency source 502, e.g., a first DPLL, and based on a frequency source signal 505 from a second frequency source 504, e.g., a second DPLL. For example, injection-locked frequency divider 506 may include one or more elements of injection-locked frequency divider 250 (FIG. 2), and/or may perform one or more operations and/or functionalities of injection-locked frequency divider 250 (FIG. 2).

In some demonstrative aspects, the first frequency source 502 and the second frequency source 504 may be implemented as uncorrelated frequency sources.

In some demonstrative aspects, as shown in FIG. 5, a detector 508, e.g., an envelope detector and/or any other detector, may be configured to detect an output voltage, denoted Vout, of an LO signal 507. For example, controller 174 (FIG. 1) may include detector 508. For example, controller 174 (FIG. 1) may be configured to control detector 508 to measure the output voltage Vout of LO signal 507, for example, upon powerup.

In some demonstrative aspects, the output voltage Vout of LO signal 507 may be compared, e.g., by controller 174 (FIG. 1), to a preset threshold level, e.g., according to a calibration table 510.

For example, controller 174 (FIG. 1) may be configured to identify a valid state of operation, for example, based on a determination that the output voltage Vout is higher than the preset threshold level. For example, the valid state of operation may be expected to maintain a phase noise of the LO signal 507 to meet a predefined specification.

In some demonstrative aspects, controller 174 (FIG. 1) may be configured to detect the breaking point, for example, based on a determination that the output voltage Vout falls below the preset threshold level.

In some demonstrative aspects, controller 174 (FIG. 1) may be configured to controllably change the phase of frequency source signals 503 and/or 505, for example, until the output voltage Vout is restored a suitable working point, e.g., until a maximum of the output voltage Vout is restored.

In some demonstrative aspects, controller 174 (FIG. 1) may be configured to trigger a sweep (512) of a phase of frequency sources 502 and/or 504, for example, based on a determination that the output voltage Vout falls below the preset threshold level.

For example, controller 174 (FIG. 1) may be configured to sweep (512) the initial phase of at least one of the frequency sources 502 and/or 504, for example, until the output voltage Vout measured by detector 508 is restored to a valid value.

For example, the calibration table 510 may be configured to maintain relevant DPLL values to be used for the phase sweep 512.

Figure 6:
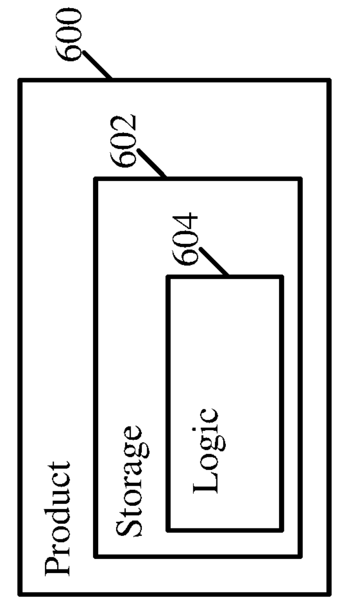
FIG. 6 is a schematic illustration of a product of manufacture, in accordance with some demonstrative aspects.

Reference is made to FIG. 6, which schematically illustrates a product of manufacture 600, in accordance with some demonstrative aspects. Product 600 may include one or more tangible computer-readable ("machine-readable") non-transitory storage media 602, which may include computer-executable instructions, e.g., implemented by logic 604, operable to, when executed by at least one computer processor, enable the at least one computer processor to perform, trigger and/or implement one or more operations and/or functionalities described with reference to the FIGS. 1-5, and/or one or more operations described herein. The phrases "non-transitory machine-readable medium" and "computer-readable non-transitory storage media" may be directed to include all machine and/or computer readable media, with the sole exception being a transitory propagating signal.

In some demonstrative aspects, product 600 and/or machine-readable storage media 602 may include one or more types of computer-readable storage media capable of storing data, including volatile memory, non-volatile memory, removable or non-removable memory, erasable or non-erasable memory, writeable or re-writeable memory, and the like. For example, machine-readable storage media 602 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), flash memory (e.g., NOR or NAND flash memory), content addressable memory (CAM), polymer memory, phase-change memory, ferroelectric memory, silicon-oxide-nitride-oxide-silicon (SONOS) memory, a disk, a hard drive, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative aspects, logic 604 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative aspects, logic 604 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, machine code, and the like.

EXAMPLES

The following examples pertain to further aspects.

Example 1 includes an apparatus comprising a Local Oscillator (LO) generator configured to generate an LO signal, the LO generator comprising a plurality of frequency sources configured to provide a respective plurality of frequency source signals according to a first frequency; and an injection-locked frequency divider configured to provide the LO signal having a second frequency, which is based on the first frequency divided by n, wherein n is an odd integer greater than 1, wherein the injection-locked frequency divider comprises a plurality of injection paths to inject the plurality of frequency source signals into an injection-locked Ring Oscillator (RO).

Example 2 includes the subject matter of Example 1, and optionally, wherein the plurality of frequency sources comprises a first frequency source to provide a first frequency source signal according to the first frequency, and a second frequency source to provide a second frequency source signal according to the first frequency, wherein the injection-locked frequency divider comprises a first injection path to inject the first frequency source signal into a first inverter stage of the injection-locked RO, and a second injection path to inject the second frequency source signal into a second inverter stage of the injection-locked RO.

Example 3 includes the subject matter of Example 1 or 2, and optionally, wherein a count of injection paths in the plurality of injection paths is equal to a count of frequency sources in the plurality of frequency sources.

Example 4 includes the subject matter of Example 3, and optionally, wherein the plurality of injection paths are configured to respectively inject the plurality of frequency source signals into the injection-locked RO.

Example 5 includes the subject matter of Example 1 or 2, and optionally, wherein a count of injection paths in the plurality of injection paths is greater than a count of frequency sources in the plurality of frequency sources.

Example 6 includes the subject matter of Example 5, and optionally, wherein two or more injection paths are configured to inject a same frequency source signal into the injection-locked RO.

Example 7 includes the subject matter of any one of Example 1-6, and optionally, wherein an injection path of the plurality of injection paths comprises a plurality of injection-locking transistors connected in series to an inverter stage of the injection-locked RO, wherein the plurality of injection-locking transistors is controllable according to a frequency source signal of the plurality of frequency source signals.

Example 8 includes the subject matter of any one of Example 1-7, and optionally, comprising a controller configured to control a phase of at least one frequency source signal of the plurality of frequency source signals based on an amplitude of the LO signal.

Example 9 includes the subject matter of any one of Example 1-8, and optionally, comprising a controller configured to control a phase difference between at least first and second frequency source signals of the plurality of frequency source signals based on an amplitude of the LO signal.

Example 10 includes the subject matter of any one of Example 1-9, and optionally, wherein the plurality of frequency sources are uncorrelated.

Example 11 includes the subject matter of any one of Example 1-10, and optionally, wherein a frequency source signal of the plurality of frequency source signals has a first phase noise, and wherein the LO signal has a second phase noise lower than the first phase noise.

Example 12 includes the subject matter of Example 11, and optionally, wherein the second phase noise is lower than the first phase noise by a factor of 10 log(m), wherein m denotes a count of frequency sources in the plurality of frequency sources.

Example 13 includes the subject matter of any one of Example 1-12, and optionally, wherein n=3.

Example 14 includes the subject matter of any one of Example 1-13, and optionally, comprising a frequency multiplier configured to multiply the second frequency of the LO signal by a factor greater than one.

Example 15 includes the subject matter of any one of Example 1-14, and optionally, wherein a frequency source of the plurality of frequency sources comprises a Digital Phase Locked Loop (DPLL).

Example 16 includes the subject matter of any one of Example 1-15, and optionally, comprising a Radio Frequency (RF) chain configured to process an RF signal based on the LO signal.

Example 17 includes the subject matter of Example 16, and optionally, comprising a wireless communication device comprising a processor to process wireless communication signals communicated by the RF chain.

Example 18 includes the subject matter of Example 16, and optionally, comprising a radar device, the radar device comprising a processor to generate radar information based on radar signals communicated by the RF chain.

Example 19 includes a vehicle comprising the apparatus of any of Examples 1-18.

Example 20 includes an apparatus comprising means for executing any of the described operations of any of Examples 1-18.

Example 21 includes a machine-readable medium that stores instructions for execution by a processor to perform any of the described operations of any of Examples 1-18.

Example 22 comprises a product comprising one or more tangible computer-readable non-transitory storage media comprising instructions operable to, when executed by at least one processor, enable the at least one processor to cause a device to perform any of the described operations of any of Examples 1-18.

Example 23 includes an apparatus comprising a memory; and processing circuitry configured to perform any of the described operations of any of Examples 1-18.

Example 24 includes a method including any of the described operations of any of Examples 1-18.

Functions, operations, components and/or features described herein with reference to one or more aspects, may be combined with, or may be utilized in combination with, one or more other functions, operations, components and/or features described herein with reference to one or more other aspects, or vice versa.

While certain features have been illustrated and described herein, many modifications, substitutions, changes, and equivalents may occur to those skilled in the art. It is, therefore, to be understood that the appended claims are intended to cover all such modifications and changes as fall within the true spirit of the disclosure.

What is claimed is:

1. An apparatus comprising:
- a Local Oscillator (LO) generator configured to generate an LO signal, the LO generator comprising:
  - a plurality of frequency sources configured to provide a respective plurality of frequency source signals according to a first frequency; and
  - an injection-locked frequency divider configured to provide the LO signal having a second frequency, wherein the second frequency is based on the first frequency divided by n, wherein n is an odd integer greater than 1, wherein the injection-locked frequency divider comprises a plurality of injection paths to inject the plurality of frequency source signals into an injection-locked Ring Oscillator (RO), wherein a frequency source signal of the plurality of frequency source signals has a first phase noise, and wherein the LO signal has a second phase noise lower than the first phase noise.

2. The apparatus of claim 1, wherein the plurality of frequency sources comprises a first frequency source to provide a first frequency source signal according to the first frequency, and a second frequency source to provide a second frequency source signal according to the first frequency, wherein the injection-locked frequency divider comprises a first injection path to inject the first frequency source signal into a first inverter stage of the injection-locked RO, and a second injection path to inject the second frequency source signal into a second inverter stage of the injection-locked RO.

3. The apparatus of claim 1, wherein a count of injection paths in the plurality of injection paths is equal to a count of frequency sources in the plurality of frequency sources.

4. The apparatus of claim 3, wherein the plurality of injection paths are configured to respectively inject the plurality of frequency source signals into the injection-locked RO.

5. The apparatus of claim 1, wherein a count of injection paths in the plurality of injection paths is greater than a count of frequency sources in the plurality of frequency sources.

6. The apparatus of claim 5, wherein two or more injection paths are configured to inject a same frequency source signal into the injection-locked RO.

7. The apparatus of claim 1, wherein an injection path of the plurality of injection paths comprises a plurality of injection-locking transistors connected in series to an inverter stage of the injection-locked RO, wherein the plurality of injection-locking transistors is controllable according to a frequency source signal of the plurality of frequency source signals.

8. The apparatus of claim 1, wherein the plurality of frequency sources are uncorrelated.

9. The apparatus of claim 1, wherein the second phase noise is lower than the first phase noise by a factor of 10 log (m), wherein m denotes a count of frequency sources in the plurality of frequency sources.

10. The apparatus of claim 1, wherein n=3.

11. The apparatus of claim 1 comprising a frequency multiplier configured to multiply the second frequency of the LO signal by a factor greater than one.

12. The apparatus of claim 1, wherein a frequency source of the plurality of frequency sources comprises a Digital Phase Locked Loop (DPLL).

13. The apparatus of claim 1 comprising a Radio Frequency (RF) chain configured to process an RF signal based on the LO signal.

14. An apparatus comprising:
- a Local Oscillator (LO) generator configured to generate an LO signal, the LO generator comprising:
  - a plurality of frequency sources configured to provide a respective plurality of frequency source signals according to a first frequency; and
  - an injection-locked frequency divider configured to provide the LO signal having a second frequency, wherein the second frequency is based on the first frequency divided by n, wherein n is an odd integer greater than 1, wherein the injection-locked frequency divider comprises a plurality of injection paths to inject the plurality of frequency source signals into an injection-locked Ring Oscillator (RO); and
- a controller configured to control a phase of at least one frequency source signal of the plurality of frequency source signals based on an amplitude of the LO signal.

15. The apparatus of claim 14, wherein the controller is configured to control a phase difference between at least first and second frequency source signals of the plurality of frequency source signals based on the amplitude of the LO signal.

16. The apparatus of claim 14, wherein the plurality of frequency sources are uncorrelated.

17. A device comprising:
- a Local Oscillator (LO) generator configured to generate an LO signal, the LO generator comprising:
  - a plurality of frequency sources configured to provide a respective plurality of frequency source signals according to a first frequency; and
  - an injection-locked frequency divider configured to provide the LO signal having a second frequency, wherein the second frequency is based on the first frequency divided by n, wherein n is an odd integer greater than 1, wherein the injection-locked frequency divider comprises a plurality of injection paths to inject the plurality of frequency source signals into an injection-locked Ring Oscillator (RO);

a controller configured to control a phase of at least one frequency source signal of the plurality of frequency source signals based on an amplitude of the LO signal;

a Radio Frequency (RF) chain configured to process an RF signal based on the LO signal;

an antenna to communicate the RF signal; and a processor configured to process information based on the RF signal.

18. The device of claim 17, wherein the plurality of frequency sources comprises a first frequency source to provide a first frequency source signal according to the first frequency, and a second frequency source to provide a second frequency source signal according to the first frequency, wherein the injection-locked frequency divider comprises a first injection path to inject the first frequency source signal into a first inverter stage of the injection-locked RO, and a second injection path to inject the second frequency source signal into a second inverter stage of the injection-locked RO.

19. The device of claim 17 comprising a wireless communication device, wherein the processor is configured to process wireless communication signals communicated by the RF chain.

20. The device of claim 17 comprising a radar device, wherein the processor is configured to generate radar information based on radar signals communicated by the RF chain.

* * * * *